United States Patent [19]
Pixley et al.

[11] Patent Number: 5,572,535
[45] Date of Patent: Nov. 5, 1996

[54] METHOD AND DATA PROCESSING SYSTEM FOR VERIFYING THE CORRECT OPERATION OF A TRI-STATE MULTIPLEXER IN A CIRCUIT DESIGN

[75] Inventors: Carl Pixley; Hyunwoo Cho; Bernard F. Plessier; Jesse R. Wilson; Ralph McGarity, all of Austin, Tex.

[73] Assignee: Motorola Inc., Schaumburg, Ill.

[21] Appl. No.: 270,601

[22] Filed: Jul. 5, 1994

[51] Int. Cl.$^6$ ............................ G06F 11/34; G11C 29/00
[52] U.S. Cl. .................. 371/22.1; 371/57.1; 395/183.19
[58] Field of Search ............................ 371/22.1, 27, 48, 371/57.1, 29.5, 59.1, 60; 370/6, 15; 395/183.19

[56] References Cited

U.S. PATENT DOCUMENTS

| | | | |
|---|---|---|---|
| 4,841,232 | 1/1989 | Graham et al. | 371/20 |
| 5,285,119 | 2/1994 | Takahashi | 371/22.1 |
| 5,361,230 | 11/1994 | Ikeda et al. | 365/194 |
| 5,373,514 | 12/1994 | Ma | 371/57.1 |
| 5,420,871 | 5/1995 | Maamari et al. | 371/29.5 |

OTHER PUBLICATIONS

Tri–state Bus Conflict Checking Method for ATPG Using BDD, Koseko; IEEE, 1993, pp. 512–515.
Graph–Based Algorithms for Boolean Function Manipulation, Bryant; IEEE, 1986, pp. 677–691.
Test Compiler Reference Manual; Synopsys. pp. 1.8, 2.3–2.4, 5.27–5.29, and 7.26–7.27.

*Primary Examiner*—Robert W. Beausoliel, Jr.
*Assistant Examiner*—Trinh L. Tu
*Attorney, Agent, or Firm*—Keith E. Witek

[57] ABSTRACT

A method (FIGS. 12–16) and a data processing system (FIG. 4) are used to verify the correct operation of one or more tri-state multiplexers (FIG. 3) located in a circuit model (37). The tri-state multiplexer checker (38) accesses the circuit model (37) and identifies the tri-state multiplexer(s). Once identified these tri-state multiplexers are checked to ensure that: (1) no two or more select/control lines to a tri-state MUX are enabled at a critical point in time wherein tri-state MUX output line contention can occur (i.e. both a logic zero and a logic one are being driven to the MUX output); and (2) that at least one select/control line is enabled during all critical periods of time so that a high impedance (high-Z) state is not propagated incorrectly through the MUX. This checking/verification is performed in a cut-set manner which is iterative and very time efficient when compared to prior methods.

31 Claims, 9 Drawing Sheets

स5,572,535

METHOD AND DATA PROCESSING SYSTEM FOR VERIFYING THE CORRECT OPERATION OF A TRI-STATE MULTIPLEXER IN A CIRCUIT DESIGN

FIELD OF THE INVENTION

The present invention relates generally to data processing systems, and more particularly, to checking the operation of tri-state multiplexers in a circuit design.

BACKGROUND OF THE INVENTION

A tri-state multiplexer (MUX) (FIG. 1) is often used in designs to save chip area and reduce delay. But if a tri-state MUX is incorrectly used, undesirable situations like erroneous/unpredictable functional behavior, excessive power consumption, and/or irreparable physical damage to the chip may arise. To avoid these problems, the designer must either verify that such conditions cannot happen or add a special circuitry to guarantee that such conditions never happen. A priority encoder is often used as the special circuitry. For verification, simulation has been used in the past.

A tri-state multiplexer can fail in at least two ways. If no select line is asserted, then the multiplexer output is not driven (i.e. a tri-state condition occurs). This can cause gates driven by the multiplexer to draw excessive current and to have uncertain output values. If more than one select line is asserted at the same time there can be a direct current path between their respective data lines. Data contention and high/excessive currents can results. Multiplexers in which neither of these conditions is present are called passing MUXs and others are called failing MUXs.

Though a priority encoder guarantees the passing condition, it increases the delay of the design, consumes chip area and increases power consumption. Even when the logic without the priority encoder already satisfies the passing condition, a priority encoder is often used just to be safe, because there has not been an efficient and effective way to verify the fact that the priority encoder is not necessary.

Simulation has been used to check the correctness of designs with tri-state MUXes. Due to the prohibitive cost, not all vectors are simulated. If there exists a vector which creates an undesirable condition at a tri-state MUX, simulation cannot detect it unless the vector is simulated. The designer is responsible to come up with a set of vectors to be simulated to check if there is a design error in using tri-state MUXes. If the designer failed to include the right vector in his or her vector set, a design error may not be detected and, thus production of malfunctioning chips may happen. The error may require a costly re-design cycle, or in the worst case, the malfunctioning chips may be shipped to the customers. Since not all vectors are simulated, it is impossible to guarantee the correctness of a design in terms of the tri-state MUX operation with the conventional simulation approach. This lack of guarantee has been the main reason why priority encoders were used despite the disadvantages in area and delay, to avoid more costly potential setbacks.

For test generation, Automatic Test Pattern Generation (ATPG) is devised to avoid generating a test vector that creates the failing condition at a tri-state MUX. The passing condition at a tri-state MUX is often referred as a design constraint which ATPG should meet with the generated test vectors. When ATPG finds that a test vector which meets the design constraints does not exist, it reports the fact. Hence ATPG may find a design error in some cases. However, if there is a vector meeting the passing condition, ATPG just chooses the vector and does not care if there is a vector with the failing condition. In other words, a circuit where ATPG generates test vectors without design constraints violation, is not necessarily a correct design. For designs using scan test methodology, some additional logic is required to avoid the failing condition at tri-state MUXes during scan shifting, even though the test vectors themselves do not create the failing condition. A priority encoder is an example of such additional logic, which as discussed above, is undesirable.

Figure 1:
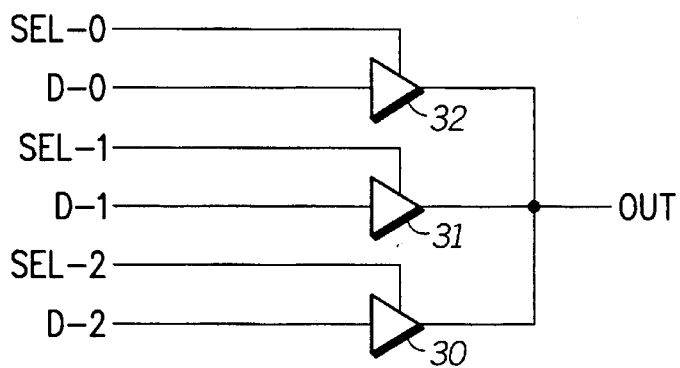
FIG. 1 illustrates, in a circuit diagram, a known gate level implementation of a multiplexer.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention provides a method and apparatus to perform checking of tri-state multiplexers to ensure that the tri-state multiplexers are operating in a proper manner. A tri-state multiplexer provides faster performance and consumes less chip area and power, over a gate-implemented multiplexer. However, a circuit with a tri-state multiplexer may generate an undesirable situation if not properly designed. If two or more select lines are enabled with data inputs driving different logic values, the circuit may show unintended functional behavior, consume excessive power, and may be damaged. A similar effect is possible if none of the select lines are enabled, thus leaving the multiplexer output floating. The tri-state MUX checker either formally verifies that a circuit with tri-state multiplexers is designed correctly to avoid such an undesirable situation, or points to the tri-state multiplexers which may show those undesirable effects. When possible, the checker can decide the passing condition without considering the entire cone of logic driving a tri-state MUX. This feature made the checker be able to deal with much larger (are more practical) circuits than previously possible.

The present invention overcomes many of the disadvantages stated in the background and can be more fully understood with reference to the FIGS. 1–16 herein. FIG. 1 illustrates a tri-state multiplexer. The tri-state multiplexer has tri-state drivers 30–32. Each driver 30–32 is enabled only if the corresponding select line (sel-#) is enabled. When the select line labeled sel-N (wherein N is an integer between 0 and 2 for FIG. 3) is enabled then the D-N value is coupled to the output node OUT.

It is possible that two or more select lines are enabled at the same time, thus connecting more than one data line to the output. For example, if SEL-0 and SEL-1 are both enabled, the output OUT is connected to D-0 and D-1 simultaneously. If D-0 and D-1 have different logic value (where a logic value is 0 or 1), a DC path may be formed. A large current may flow through the DC path and damage the chip. If both the drivers have the same strength, it is unpredictable what value will be eventually reached at the output OUT. With different strengths, a fixed value may be reached eventually, but the DC path slows down the circuit and may consume excessive power or damage the circuit permanently. Hence, a DC path should be avoided as often as possible.

In FIG. 1, it is also possible that none of the select lines are enabled. In this case, all three drivers (30, 31, and, 32) go into the high impedance state (tri-state) and thus leave the output value OUT electrically floating. This also generates an undesirable situation where the output value is unpredictable and, if connected to the inputs of other gates, a DC path may form. Hence, a floating value at the output of a tri-state MUX should be avoided as well.

Figure 2:
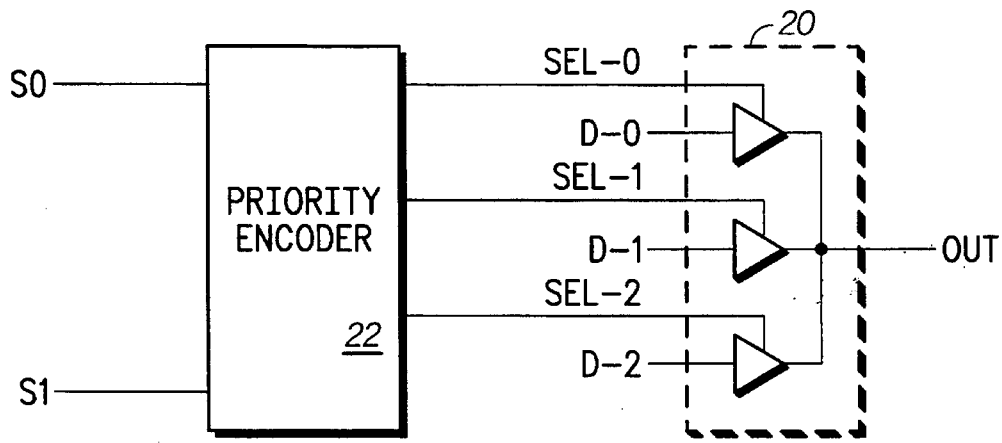
FIG. 2 illustrates, in a block diagram, a known tri-state multiplexer with a priority encoder circuit.

As mentioned in the background section, a priority encoder may be and has been used to avoid the problems listed above. FIG. 2 illustrates a priority encoder (22) connected to a tri-state multiplexer (20). A priority encoder for an N-input tri-state multiplexer has N outputs and N–1 inputs. The inputs to the priority encoder are prioritized so that if two or more inputs are enabled, the output corresponding the input with the highest priority is enabled while all the other outputs are disabled. When none of the N–1 inputs are enabled, the N-th output is enabled. For example, if both S0 and S1 are enabled in FIG. 2, only SEL-0 is enabled since S0 has a higher priority than S1. If both S0 and S1 are disabled, SEL-2 is enabled. A priority encoder ensures that at least one output and only one output of the MUX is enabled at any time.

Though a priority encoder guarantees proper behavior of a tri-state multiplexer, the use of a priority encoder is not desirable due to following reasons. In FIG. 2, suppose that the designer knows that S0 and S1 can never be enabled at the same time (i.e., they are mutually exclusive), then he or she does not need the logic determining the priority between S0 and S1, and therefore should not have to tolerate the unnecessary area, delay, and power overhead due to the extra logic (i.e. the priority encoder). Another example is when the designer wants to enable two or more drivers driving the same logic value to boost the performance. In this case, a priority encoder cannot be used because it allows only one driver being enabled. In some cases, two select lines can "on" and select two buffers as long as the buffers pass the same logic value. In this case, faster electrical responses can be attained.

Figure 3:
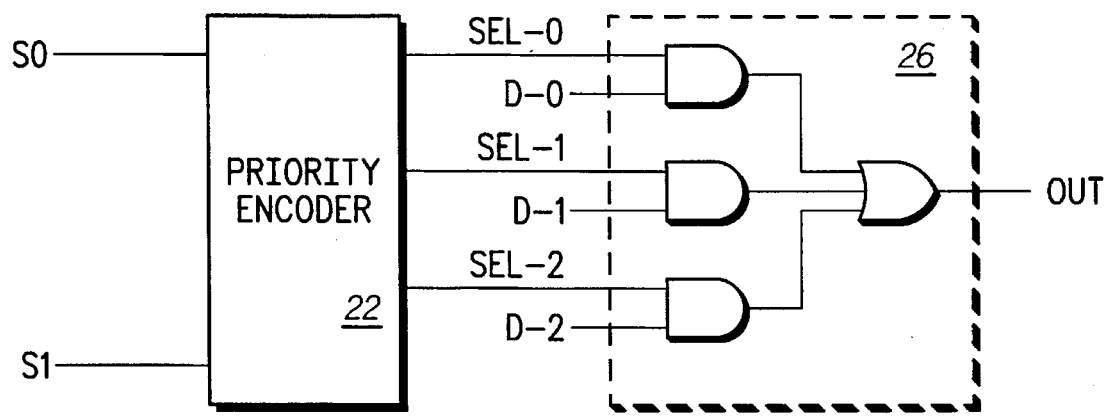
FIG. 3 illustrates, in a circuit diagram, a tri-state multiplexer (MUX) in accordance with the present invention.

FIG. 3 illustrates a circuit comprising of a priority encoder 24 and an AND-OR gate 26 comprised of AND gates and an OR gate. This circuit is a logically-equivalent circuit of FIG. 2 by replacing the tri-state multiplexer 20 with the AND-OR gate 26. Note that the two circuits are logically equivalent only when the priority encoder 22 is used. In general, the AND-OR gate and the tri-state multiplexer behave differently and one cannot be replaced by the other unless priority encoder technology is utilized. Hence, a designer cannot avoid the problems with tri-state multiplexers in his or her design by replacing them with AND-OR gates. Besides, the circuit in FIG. 3 consumes more area than that of FIG. 2 and is usually slower in operation.

To avoid problems listed above, a tri-state multiplexer should be carefully checked during design to ensure: (1) that no two select lines which have different input logic values are enabled at or around a critical period of time; and (2) that at least one select line is enabled during all critical time periods. A critical time typically being the time wherein an active clock edge is experienced by the circuit module or processor which includes the tri-state multiplexer. An active edge being a transition edge of a clock signal (0-to-1 or 1-to-0) which causes some function or transfer of data to be performed though the tri-state multiplexer. For simplicity, the term one-hot condition or passing condition will be used as a conjunction of (1) and (2). A tri-state multiplexer with two or more select lines enabled with the same logic value at the corresponding data inputs is often used to speed up the circuit. Note that such a multiplexer is considered as a passing MUX due to the above listed conditions. It is the efficient checking of these tri-state multiplexers that is taught in detail in subsequent paragraphs.

Figure 4:
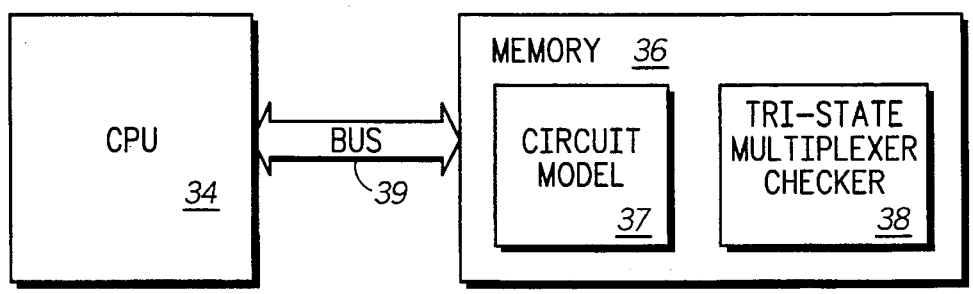
FIG. 4 illustrates, in a block diagram, a data processing system for verifying or checking a tri-state multiplexer for correct operation in accordance with the present invention.

FIG. 4 illustrates a data processing system which used to check all tri-state multiplexers in a circuit design as discussed above. The data processing system has a central processing unit (CPU) 34 coupled to a memory unit 36 via a bus 39. The memory 36 contains a description of a circuit model 37 which includes one or more tri-state multiplexers. The circuit model 37 is accessed and/or parsed by the tri-state multiplexer checker 38 which checks the tri-state multiplexers resident in the circuit model 37 for proper operation as indicated above. The tri- state multiplexer checker 38 determines which tri-state multiplexers in model 37 are passing or failing. This passing and/or failing information is used by a circuit designer and/or a circuit tester to determine: (1) if the tri-state multiplexers without encoders (which are preferred for speed reasons) are safe and in a passing condition; (2) if a priority encoder needs to be added to one or more tri-state multiplexers for design safety; or (3) if a designer can redesign the control inputs or data inputs to a failing tri-state multiplexer to make the tri-sate multiplexer pass in A subsequent verification/checking process.

Figure 5:
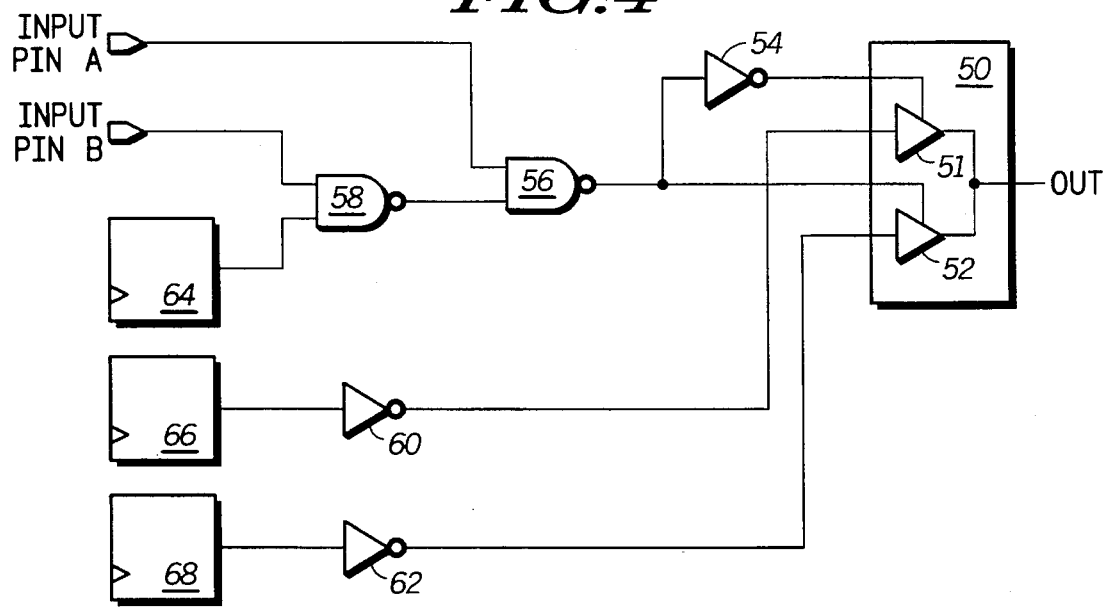
FIG. 5 illustrates, in a block diagram, a tri-state multiplexer circuit which is checked/verified in accordance with the present invention.

FIG. 5 illustrates a typical tri-state multiplexer (MUX) circuit which could be located in the circuit model 37 of FIG. 4. The tri-state MUX checker/verifier 38 from FIG. 4 identifies that a tri-state MUX 50 is in the circuit and that this MUX requires checking/verification. The tri-state multiplexer 50, which consists of two transmission gates 51 and 52, is driven by a cone of logic made of NAND gates 58 and 56, three inverters 54, 60, and 62, three storage devices 64, 66, and 68, and two input pins A and B. A cone of logic to a multiplexer is the set of combinational gates, input pins, storage devices, and connections such that each member of this set is either directly connected to the multiplexer or connected to the multiplexer through one or more combinational gates. For example, the cone of logic feeding the control input of the transmission gate 51 consists of gates 54, 56, 58, the input pins A, B, and the storage device 64. Note that the input of the storage device 64 is not in the cone of logic.

Figure 6:
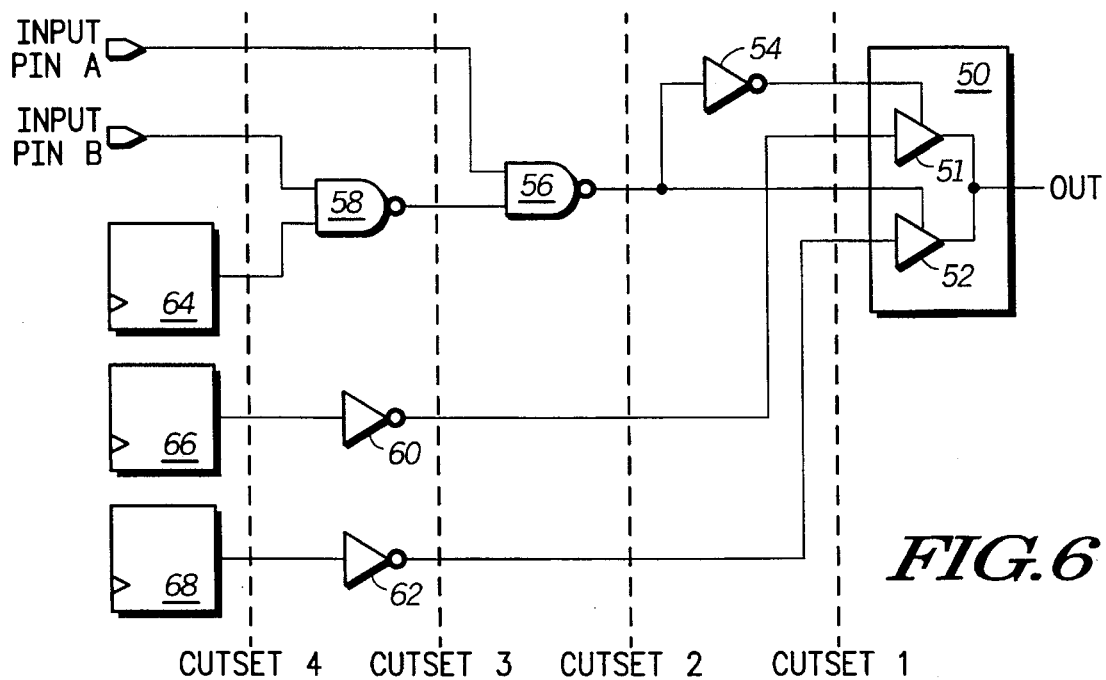
FIG. 6 illustrates, in a block diagram, the circuit of FIG. 5 wherein a cut-set approach to MUX checking is used in accordance with the present invention.

FIG. 6 illustrates the circuit of FIG. 5 in more detail. The process for verifying the proper operation of the MUX 50 via checker 38 uses a technique referred to as cut-setting. This method is described below with reference to FIG. 6. An occurrence is a combinational gate, an I/O terminal, or a storage device. A cut-set of a logic cone of a multiplexer is a set of occurrences such that at least one occurrence in this set appears in any path from an input pin or a storage device to the multiplexer. For example, in FIG. 6, occurrences 56, 60, and 62 form a cut-set (cut-set 2) of the logic cone driving the multiplexer 50. Occurrences 54, 56, 60, and 62 also form a cut-set (cut-set 1). To verify that only one select line to a multiplexer is enabled at any critical time, a cut-set is useful in the following sense. A cut-set defines a subset of a logic cone. A subset of a logic cone corresponding to a cut-set is the set of occurrences and connections among them between the tri-state multiplexer and the cut-set. If each output of a cut-set occurrence is treated as if it was an input pin, and if only one select line is enabled under that assumption in the subset of the logic cone defined by the cut-set, then the multiplexer satisfies the one-hot condition. But if the multiplexer does not satisfy the one-hot condition in the subset of the logic cone, that does not necessarily mean the multiplexer is failing, unless the subset is the entire logic cone itself. Usually, a failing cut-set means that a larger cut-set must be selected next and processed to determine passing or failing (sometimes an indeterminate finding can be made as well if memory requirements for the cut-setting becomes extremely large). When the cut-set subset equals the entire cone of logic and failure is the result, then the MUX is a failing MUX.

For example, the cut-set 1 (occurrences 54, 56, 60 and 62) in FIG. 6 may be used for one-hot checking of the multiplexer 50. The logic which feeds inputs to the right side of the dotted line denoted CUTSET 1 is considered as if it was the entire cone of logic and any connection crossing the dotted line is considered as an independent input pin. The logic functions for the inputs of the multiplexer 50 is generated using the cut-set occurrence outputs as variables for the logic functions. A logic function at a gate output is generated by performing the logic operation of the functions associated with the inputs of the gate. In the logic equations used, *' means a Boolean AND operator, +' means a Boolean OR operator, '' means a Boolean NOT operator following the operand, and !=' means is not equal to '. Using the CUTSET 1 in FIG. 6, let the output of the occurrence 54 be a variable v1, and the output of the occurrences 56, 60, and 62 be v2, v3, and v4 respectively. Let the logic functions of the inputs of the multiplexer 50 be f1, f2, f3, and f4, where f1 is associated with the control input of the transmission gate 51, f2 is the control input of the transmission gate 52, f3 the data input of the transmission gate 52, and f4 the data input of the transmission gate. Then f1=v1, f2=v2, f3=v3, and f4=v4. Since all variables are assumed to be independent, f1+f2= v1+v2!=1, i.e., both control inputs can be disabled simultaneously, leaving the multiplexer output floating. Hence, under the cut-set CUTSET 1, the one-hot property does not hold. In this case, a larger cone of logic is used by employing another cut-set. If the cut-set CUTSET 2 in FIG. 6 is used, the variable v1 (associated with the output of the occurrence 54) is no longer needed since the function of the occurrence 54 (an inverter) is f1=v2'. Others are the same as for CUTSET 1, i.e., f2=v2, f3=v3, and f4=v4. Now f1+f2=v2'+v2=1 which is passing. Also, f1*f2*(f3 XOR f4)= v2'*v2*(v3 XOR v4)=0. Therefore, the one-hot property holds with the cut-set CUTSET 2. Hence we can conclude that the multiplexer 50 is operating correctly without having to consider the entire cone of logic for the multiplexer 50 thereby saving machine memory and improving test time.

Figure 7:
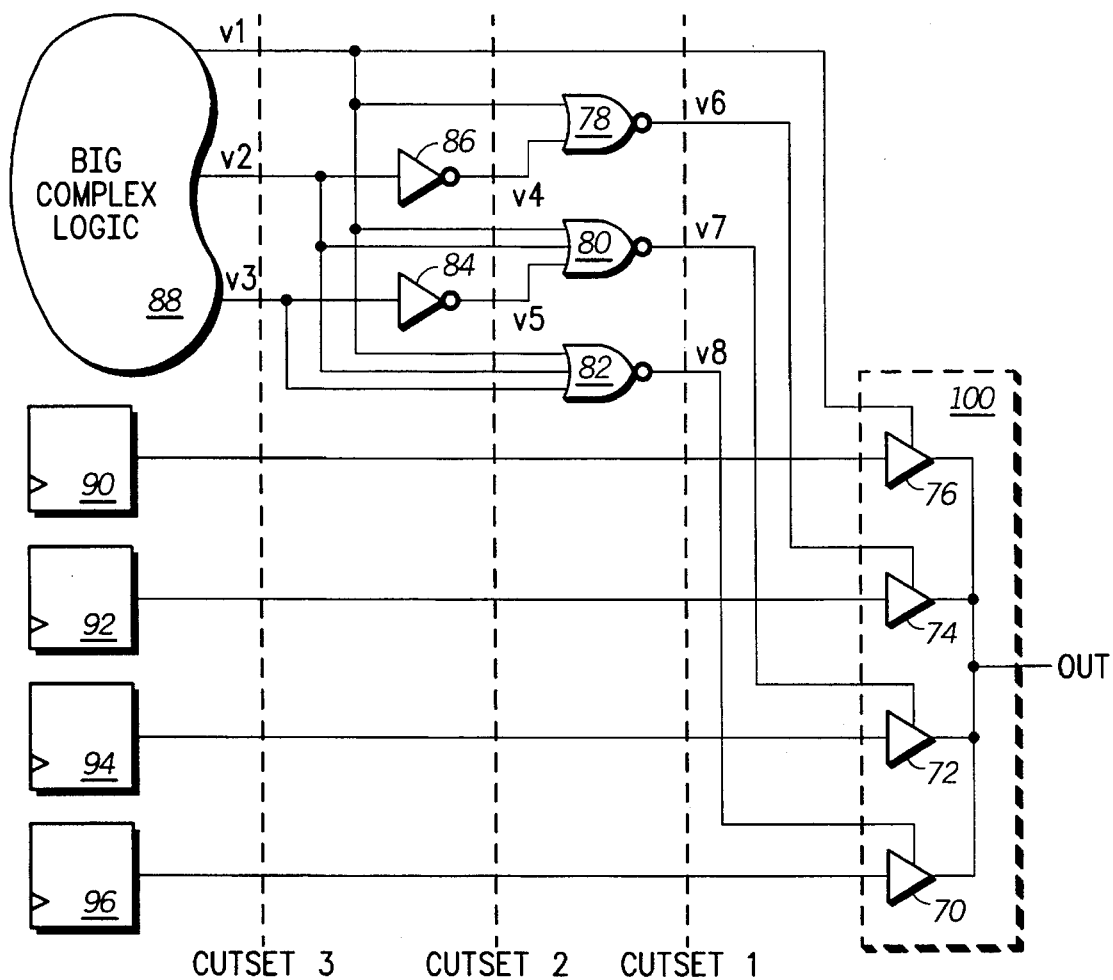
FIG. 7 illustrates, in a block diagram, another tri-state multiplexer circuit which is checked/verified in accordance with the present invention.

FIG. 7 illustrates another more complex circuit which may be accessed from the circuit model 37 of FIG. 4. The multiplexer 100 is a 4-to-1 MUX made of transmission gates 70, 72, 74, and 76. MUX 100 data inputs are connected to the outputs of storage devices 90, 92, 94, and 96. MUX 100 has select inputs which are connected to an encoding logic consists of 2 inverters, 84 and 86, and three NOR gates, 78, 80, and 82. The encoding logic is connected to a big complex piece of logic denoted as logic 88. Let v1, v2, and v3 be variables associated with the out-coming signals from logic block 88 as illustrated in FIG. 7, and v4 and v5 be variables for the output of gate 86 and 84 respectively. Let v6, v7, and v8 be variables associated with the outputs of the NOR gates 78, 80, and 82, respectively. Let f1, f2, f3, and f4 be the logic functions for the select lines of the multiplexer 100. Using the cut-set CUTSET 1, we can immediately see the one-hot condition fails, e.g., f1*f2=v1*v6!=0. If we use the cut-set CUTSET 2, f1=v1, f2=v1'*v4', f3=v1'*v2'*v5', and f4=v1'*v2'*v3'. Hence, f2*f3= v1'*v2'*v4'*v5'!=0 and the one-hot condition fails due to mutual exclusion violation. However, if the cut-set CUTSET 3 is used, f1=v1, f2=v1'*v2, f3=v1'*v2'*v3, f4=v1'*v2'*v3' and they satisfy the one-hot condition. In other words., f1*f2=v1*v1'*v2=0, f1*f3=v1*(v1'*v2'*v3)=0, f1*f4= v1*(v1'*v2'*v3')=0, f2*f3=(v1'*v2)*(v1'*v2'*v3)=0, f2*f4=(v1'*v2)*(v1'*v2'*v3')=0, f3*f4= (v1'*v2'*v3)*(v1'*v2'*v3')=0, and f1+f2+f3+f4=v1 +(v1'*v2)+(v1'*v2'*v3)+(v1'*v2'*v3')=v1+(v1'*v2)+ (v1'*v2'*(v3+v3'))=v1+(v1'*v2)+(v1'*v2')=v1 +v1'*(v2+v2')=v1 +v1'=1. Note that we did not have to evaluate the complex logic functions associated with the logic block 88 in determining the passing condition of the multiplexer 100 which is extremely advantageous.

Figure 8:
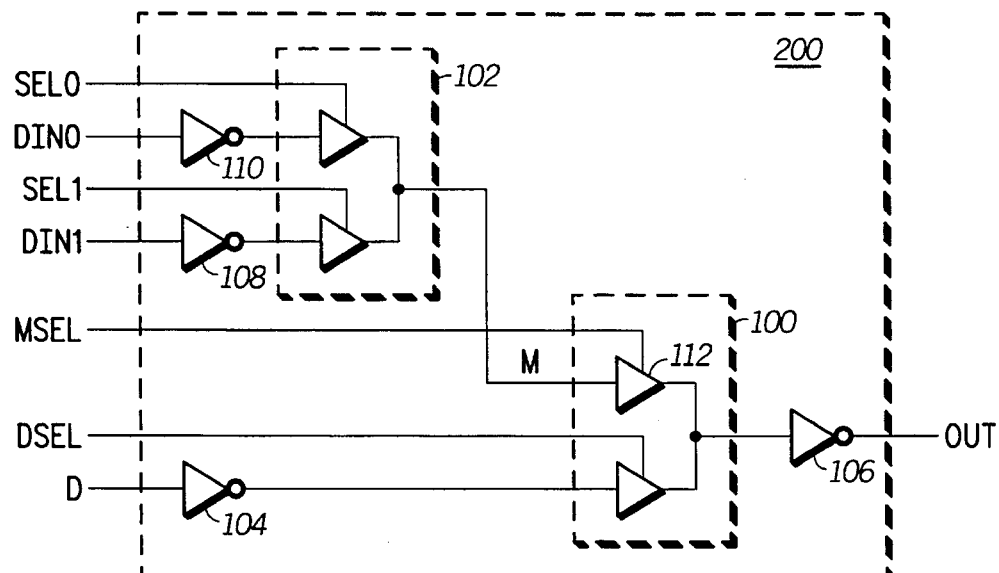
FIG. 8 illustrates, in a block diagram, a dual tri-state multiplexer circuit which is checked/verified in accordance with the present invention.

FIG. 8 illustrates a module containing two multiplexers where the first tri-state multiplexer 100 has an input connected to the output of a second tri-state multiplexer 102. The multiplexer 102 is a 2-to-1 MUX having two data inputs (din0 and din1) and two select/control inputs (sel0 and sel1). Inverters 110 and 108 are respectively used to invert the signals din0 and din1 before the signals are input to the MUX 102. The MUX 102 provides an output M which is determined as a function of sel0 and sel1. The MUX 100 has an input M from MUX 102, and a second input D provided through an inverter 104. The MUX 100 provides an output OUT through an inverter 106. If multiple multiplexers are used in a module, a modified one-hot condition may be used for the passing condition of the module. Instead of checking the one-hot condition separately for multiplexers 100 and 102, a modified condition may be checked for the module 200. If this condition is satisfied the module may be considered as a good one even if the one-hot property for the multiplexers 100 and 102 are not satisfied separately.

In this module for example, even if the output of the multiplexer 102 is floating, if the transmission gate 112 is not driving, i.e., MSEL is not high, a disadvantageous situation will not arise. The user may define the modified one-hot passing condition for a module and provide it to the multiplexer checker to replace the standard one-hot property. Then the MUX checker checks if the user-defined property always holds.

Figure 9:
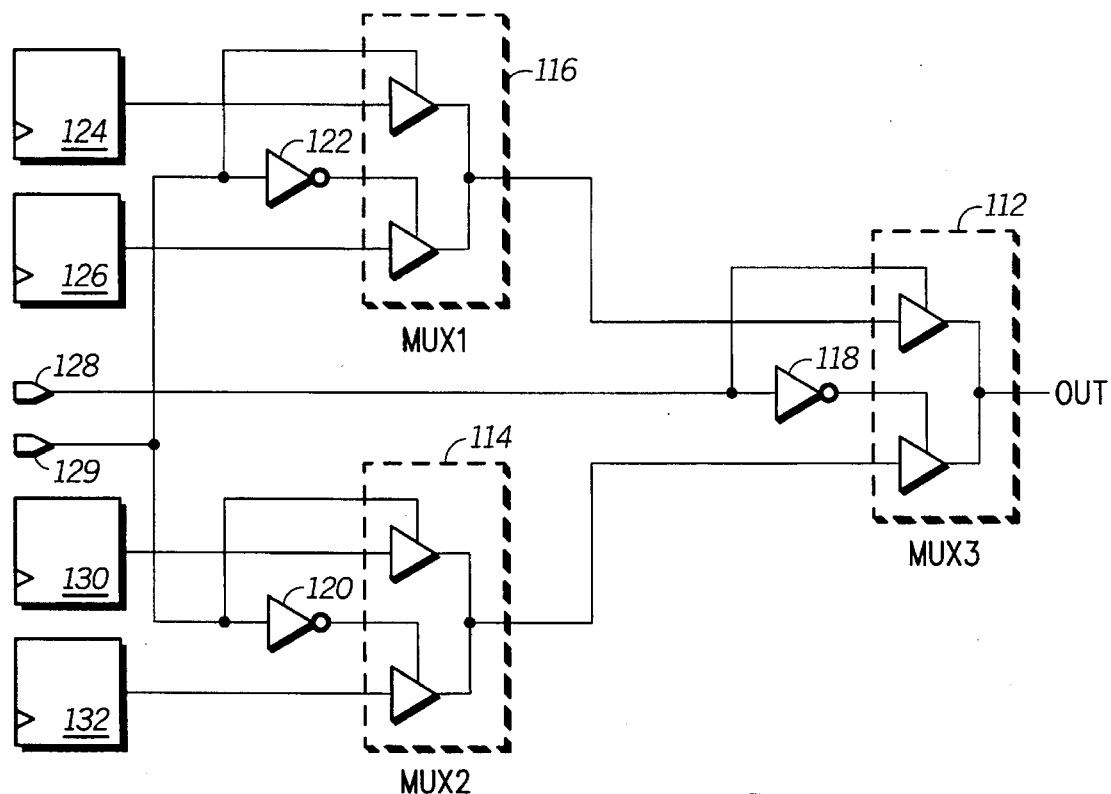
FIG. 9 illustrates, in a block diagram, a triple tri-state multiplexer circuit which is checked/verified in accordance with the present invention.
Figure 10:
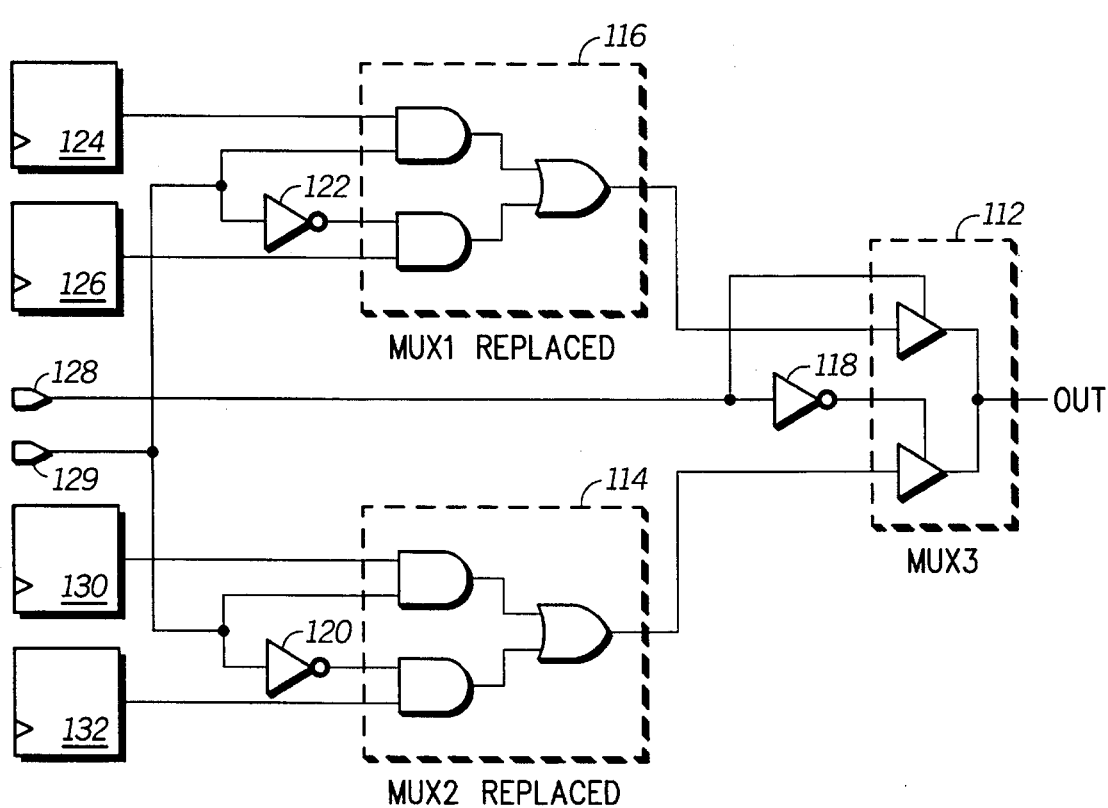
FIG. 10 illustrates, in a block diagram, the circuit of FIG. 8 replaced by a gate level implementation MUX in accordance with the present invention.

FIG. 9 and FIG. 10 illustrate how nested multiplexers are processed. FIG. 9 illustrates a circuit having tri-state MUXes 112, 114, and 116. Inverter 120, 122, and 118 are used in FIG. 9 to invert select/control signals. An output of MUX 112 is labeled as OUT. Data inputs and control/select signals to the MUXes 112, 114, and 116 are provided via four D flip-flops 124, 126, 130, and 132 and via two input terminals/pins 128 and 129. FIG. 10 illustrates the circuit of FIG. 9 after MUXes 116 and 114 have been tested/verified and achieved a passing state. A tri-state multiplexer does not have a matching Boolean equation for its functionality as a stand-alone circuit. However, if properly used, a Boolean function can be implemented at the output of a tri-state multiplexer and this is possible if the one-hot condition is satisfied. Hence, whenever the Boolean function at the output of an already verified multiplexer is needed, an AND-OR gate structure, which gives an equivalent function to the tri-state multiplexer under the one-hot condition, is used to compute the function. In other words, the tri-state MUX can be logically "replaced" or "substituted" with a gate equivalent MUX for verification purposes of other MUXes in the system. FIG. 10 illustrates that the MUXes 114 and 116 are already verified and marked as AND-OR gate replaceable so that a Boolean function can be generated if the need arises in the subsequent operation of the multiplexer checker.

While a passing multiplexer is treated as if it was an AND-OR gate, a failing multiplexer is treated as if it was an intermediate cut-set point. If a multiplexer, which is connected either directly to or through other occurrences to the failing multiplexer, passes using the failing multiplexer as a cut-set point, then no error message is generated for the passing MUX. This is to better pin-point where the design error is, so that the designer can focus on the actual problem point. For example, if a failing MUX output is connected (either directly or through other occurrences) to several other multiplexers with priority encoders, we know that the problem is in the part of design controlling the inputs of the failing MUX, not in the part for other multiplexers. When the designer fixes the problem for the failing MUX, all the MUXes are rechecked by the MUX checker in a new pass of verification.

Figure 11:
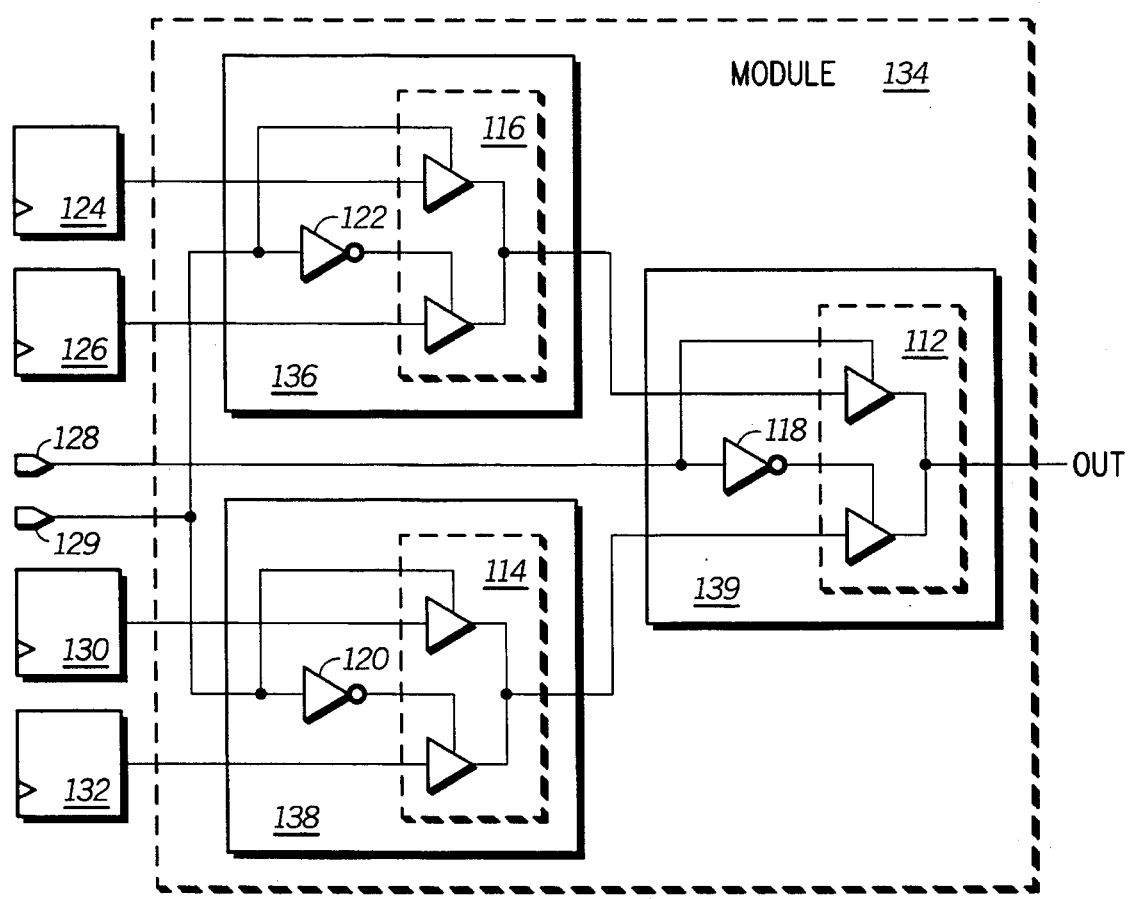
FIG. 11 illustrates, in a block diagram, a circuit which is hierarchically module checked in accordance with the present invention.

FIG. 11 illustrates the circuit of FIG. 9 wherein the circuit of FIG. 9 is a part of a larger circuit module 134. Also, each MUX 112, 114, and 116 along with any corresponding logic elements are grouped into individual modules referred to as modules 136, 138, and 139. The modules 136, 138, and 139 are three different instantiation of the same module type. In the module 136, we can decide the multiplexer 116 satisfies the one-hot condition because the two select lines are inverted signals of each other by the inverter 122, without looking at the outside environment of the module 136. Since the module 138 and 139 are just instantiations of the same module type, we can conclude that the multiplexer 112 and 114 satisfy the one-hot condition respectively without explicitly checking it. Also in the module 134, the three MUXes 112, 114, and 116 satisfy the one-hot condition no matter what input values are applied to the module. Hence, we do not have to explicitly check the one-hot property for the three multiplexers in the module, when the module is used in other places in the circuit. Therefore, in some cases, if pieces of a module pass, then the entire module can automatically be set to a passing state and so on up a design hierarchy.

Figure 12:
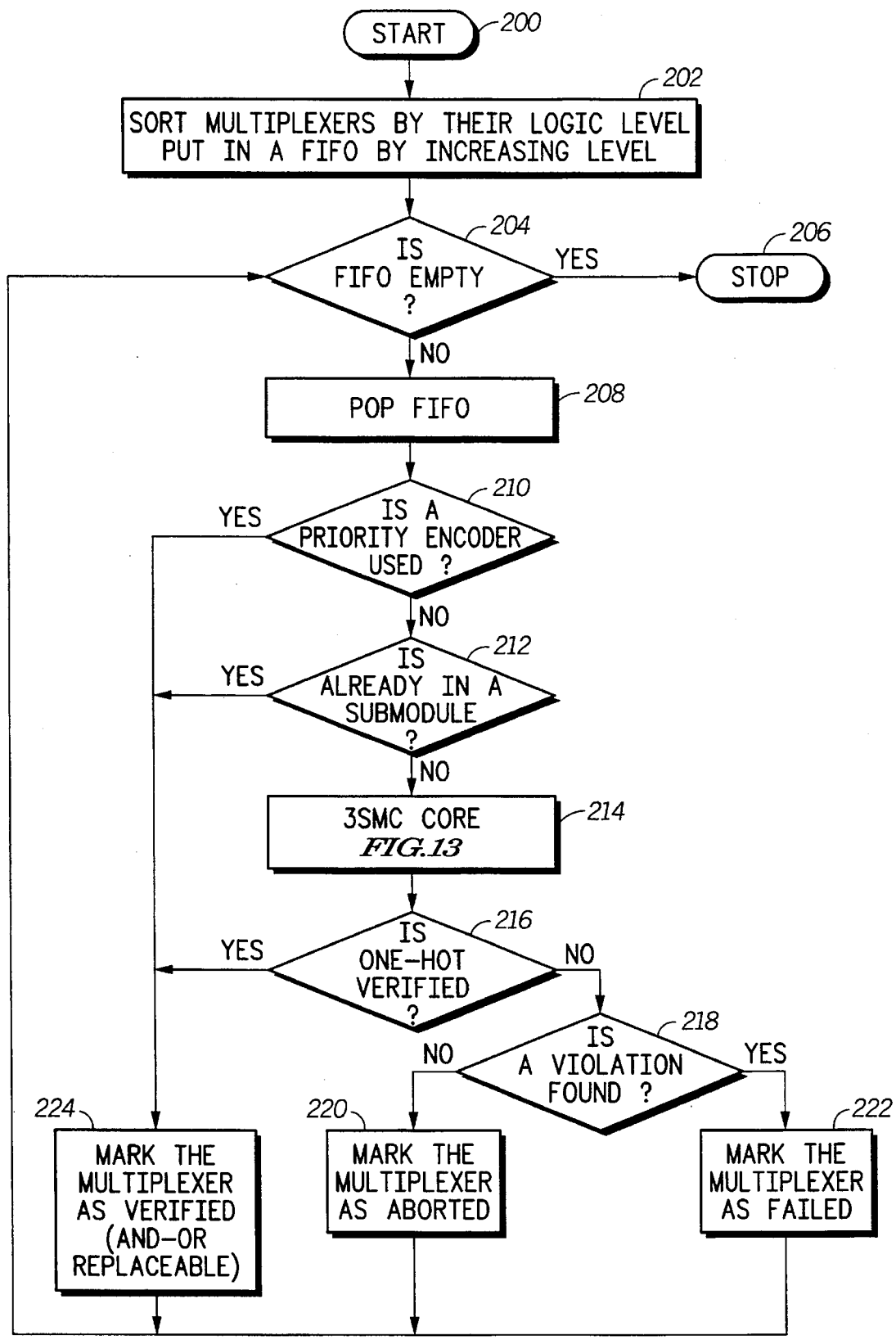
FIGS. 12–16 illustrate, in a flowchart, a method for verifying/checking tri-state multiplexer (MUX) circuits in accordance with the present invention.

FIGS. 12–16 illustrate in flowcharts a method for checking tri-state multiplexer(s) for a passing state or failing state. FIG. 12 illustrates the top level flow of an implementation of the methods described above. In the step 202, all multiplexers in the circuit are identified and sorted so that a multiplexer which may affect the one-hot condition of another multiplexer is put earlier in the order. Then a multiplexer is processed one at a time following the order. The step 210 checks if a priority encoder is explicitly used to guarantee the one-hot condition. The step 212 checks if the multiplexer was already verified in a module as illustrated in FIG. 11. If the one-hot condition is not established so far, the core portion of the multiplexer checker is invoked, which is subsequently illustrated in FIG. 13, FIG. 14, and FIG. 15. If the multiplexer is verified to be one-hot, the fact is marked as illustrated in FIG. 10 at the step 224.

Figure 13:
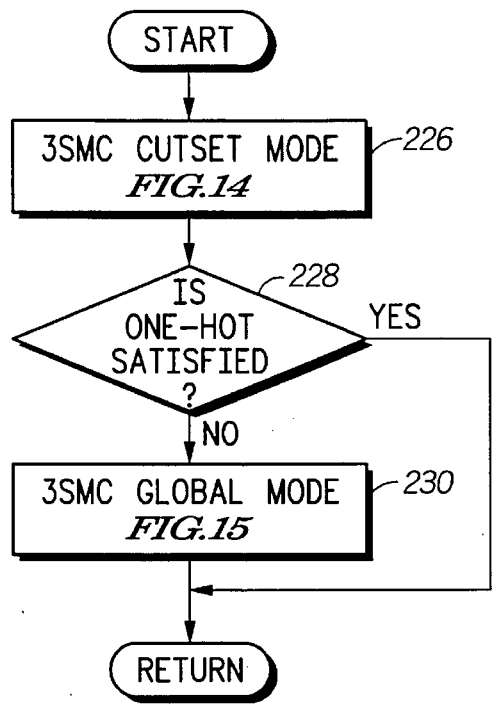

FIG. 13 shows that the cut-set method is used before the global mode. The global mode is the case when the used cut-set consists only of storage devices, black boxes, and input terminals. The step 228 checks if the one-hot condition is verified, and if so, the global mode is bypassed. Note that only passing condition can be established by the cut-set mode.

Figure 14:
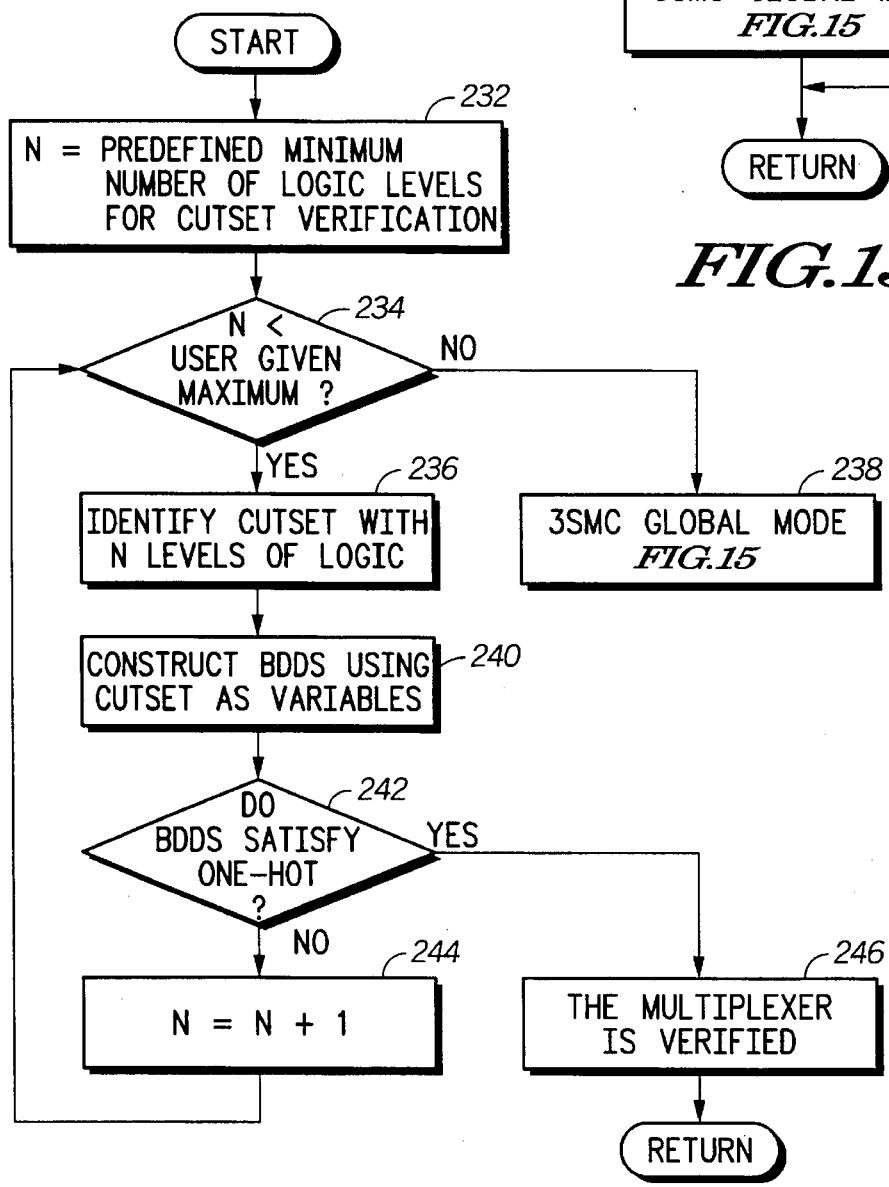

FIG. 14 shows the details of the cut-set mode of 3SMC. The checker tries to establish the passing condition in the vicinity of the multiplexer by considering N levels of logic only, using a cut-set. If the one-hot condition is satisfied, the checker stops and returns from the cut-set mode with the passing status. If the one-hot condition is not satisfied, N is incremented and the one-hot condition is reevaluated with the larger cone of logic, until N hits the maximum given by the user. If the number of logic levels reaches the predefined limit without producing the passing condition, the global mode is invoked at the step 238.

Figure 15:
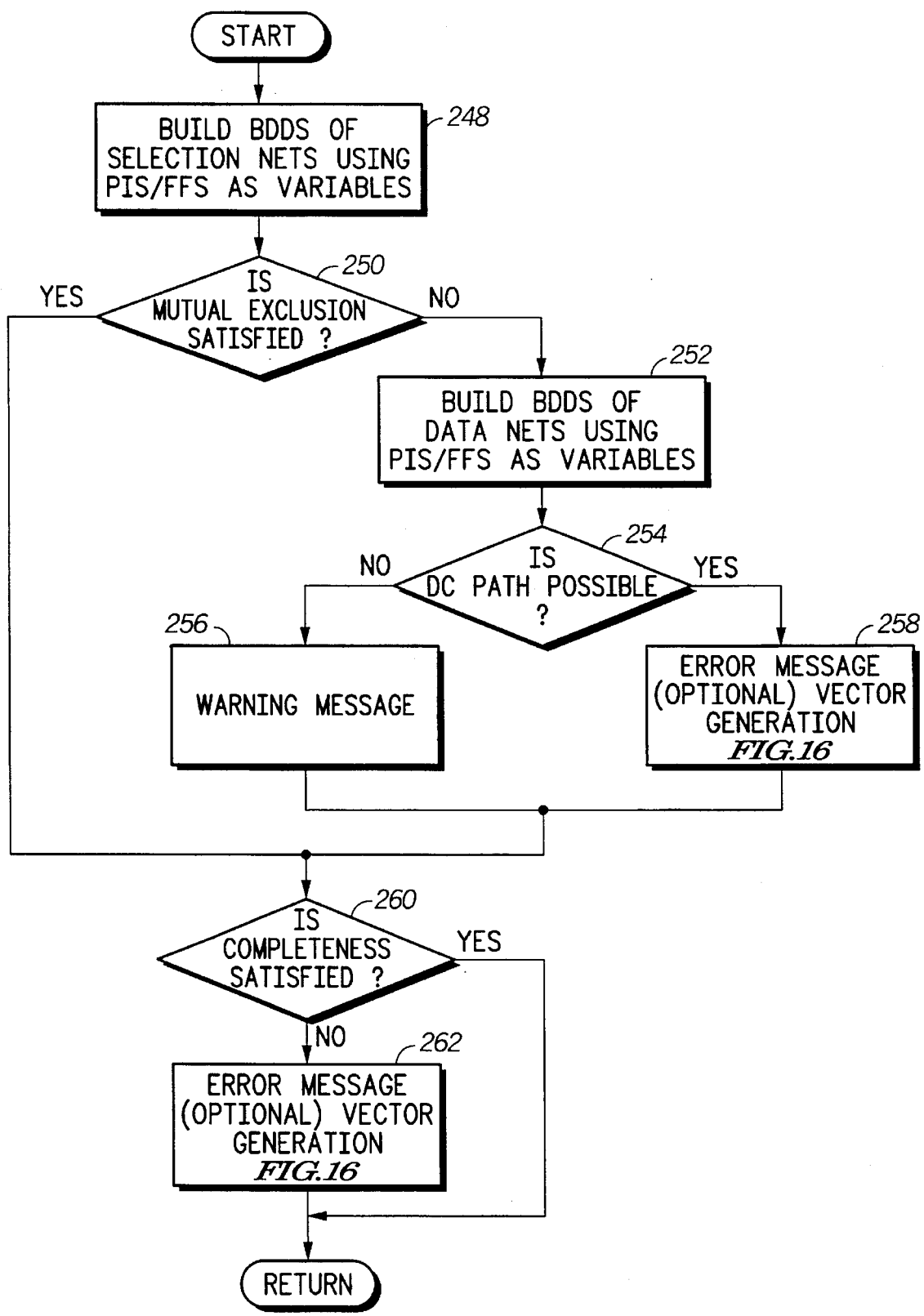

FIG. 15 illustrates the global mode of 3SMC. The step 248 computes the Boolean equations for the select/control signals of the multiplexer. If mutual exclusion is not satisfied, Boolean equations for data inputs are generated (the step 252) to check if the logic values on the inputs where the mutual exclusion is violated are different logic values thus forming a DC path in the circuit. If DC path is possible, an error message is issued and the input vector which exercise the DC path is generated if needed (the step 258). Though a mutual exclusion is not preserved, if no DC path is possible, only a warning message is generated. When the mutual exclusion check is done, the completeness condition is evaluated at the step 260. If the completeness condition is violated, an error message is issued and an optional vector generation is done at the step 262.

Figure 16:
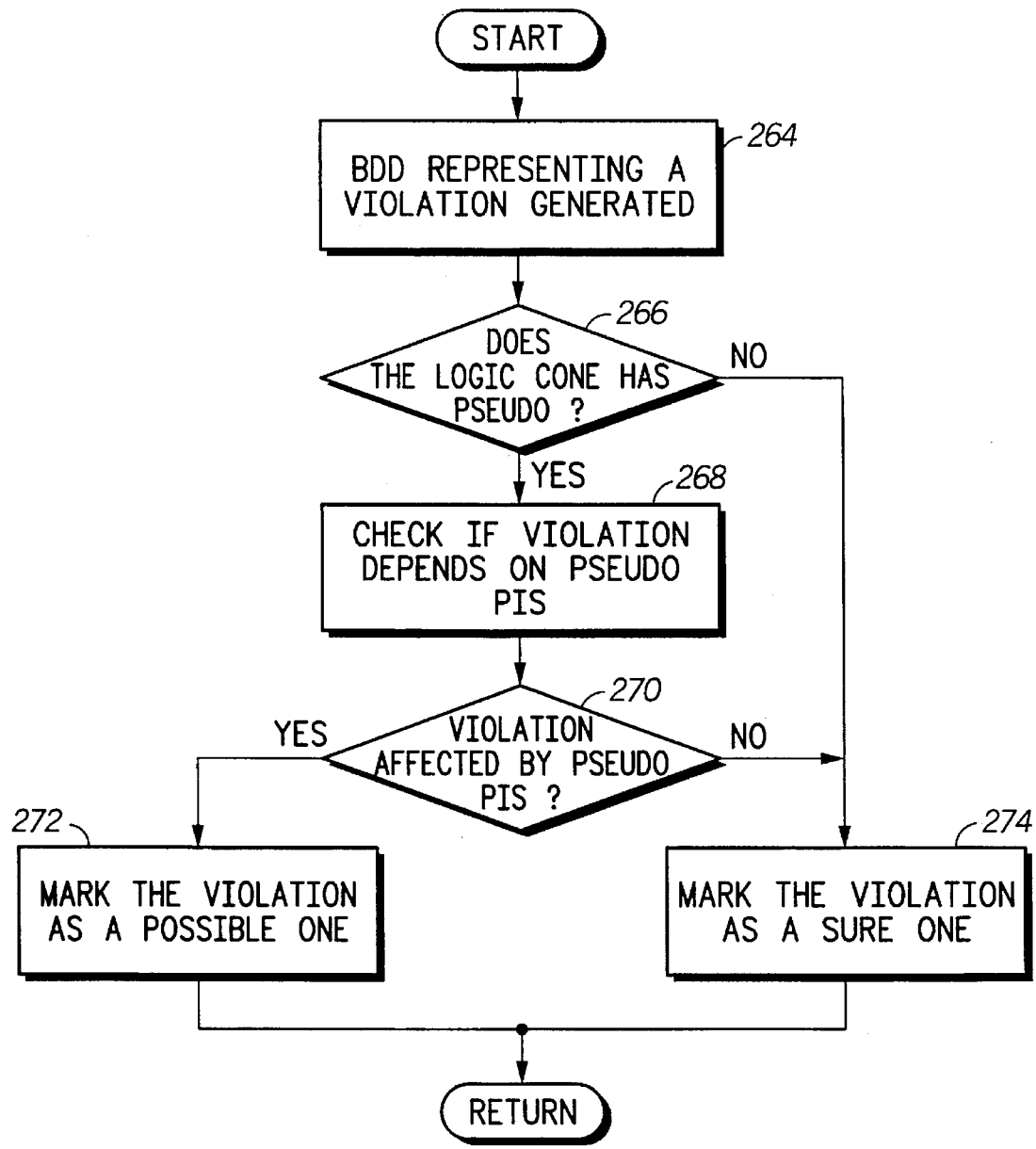

In generating an error message for a failing condition, a false negative may be generated. In other words, the checker may report an error when there actually is no error. This is possible due to the missing information related with a black box or a failing multiplexer affecting the multiplexer under the checking. FIG. 16 describes how the number of false negatives may be reduced when some pseudo primary inputs exist. A pseudo primary input is an output of a black box or an output of a failing multiplexer. They are named so because they are treated as if they were primary inputs while they are not in fact primary inputs (such as an input pin or a flip-flop output). The checker computes the condition for violation (the step 264) and then checks if the violation condition depends on the pseudo primary inputs by first topologically observing if there is a connection from a pseudo primary input to the multiplexer (the step 266) and then checking if the logic function for the violation condition depends on the pseudo primary input variables (the step 268). If the violation logic function does not depend on pseudo primary inputs (the step 270), then the error is not affected by the pseudo primary inputs and the error is not a false negative. Then the error is reported as a sure error (the step 274). If we fail to establish that the error is not affected by the pseudo primary inputs, then the error is reported as a possible error meaning that it might be a false negative (the step 272). A sure violation is guaranteed not to be a false negative, while a possible error may or may not be a false negative. This helps reducing the time spent by the user to determine if an error is real.

While the present invention has been illustrated and described with reference to specific embodiments, further modifications and improvements will occur to those skilled in the art. For example, the current invention uses the data structure known as Binary Decision Diagram (BDD) to represent Boolean logic functions. Any future improvement or past development in the BDD data structure can be transparently applied to the framework of the invention to achieve better performance. In the cut-set method, a heuristic to find a good cut-set may be devised by taking advantage of design hierarchy or other structural information. This may speed up the process by reducing the time wasted on verification effort with improper cut-sets. Tri-state buffers or other circuitry may be checked using the methods taught herein. It is understood, therefore, that it is intended in the appended claims to cover all modifications that do not depart from the spirit and scope of this invention.

What is claimed is:

1. A method for checking a tri-state multiplexer for proper operation, the method comprising the steps of:

(a) accessing circuit data from a circuit model wherein the circuit model has at least one tri-state multiplexer, the tri-state multiplexer having at least one output, a plurality of control inputs which selectively determine a logic state of the at least one output, and a plurality of data inputs, each control input being coupled to a cone of logic which determines a logic signal which is provided to each respective control input, one cone of logic having N serially coupled logic devices, the N serially coupled logic devices being rank-ordered such that a first logic device in the N serially coupled logic devices is directly coupled to one control input of the tri-state multiplexer and the Nth serially coupled logic device is farthest removed in coupling from the one control input of the tri-state multiplexer, N being a finite integer greater than zero;

(b) identifying the tri-state multiplexer and the one cone of logic in the circuit model;

(c) forming a data structure corresponding to each control input in the tri-state multiplexer, the data structure being formed using a sub-portion of the one cone of logic;

(d) determining a condition of the tri-state multiplexer using the data structure wherein a passing condition is determined if only one control input in the plurality of control inputs to the tri-state multiplexer is enabled at a critical period of time, a failing condition is determined if more than one or no control inputs are enabled to the tri-state multiplexer at a critical period of time;

(e) providing either the passing condition or the failing condition to a user if a passing or failing condition can be determined from step (d);

(f) forming a different data structure which is different from the data structure formed in step (c) by using a sub-portion of the one cone of logic which is larger than the sub-portion used in step (c) if a failing condition is determined in step (d); and (g) repeating steps (c) through (g) until either the sub-portion equals the entire one cone of logic or a passing condition is determined.

2. The method of claim 1 wherein the step (d) further comprises:

determining a passing condition instead of a failing condition if a plurality of control signals to the tri-state multiplexer are asserted and each input signal corresponding to each asserted control signal in the plurality of control signals conducts a same logic value.

3. The method of claim 1 wherein the step (e) comprises:

considering the tri-state multiplexer as a gate level implementation multiplexer for subsequent checking if a passing condition is determined.

4. The method of claim 1 wherein the step (a) comprises:

accessing circuit data wherein at least one data input of the tri-state multiplexer has a logic value which is determined via another tri-state multiplexer.

5. The method of claim 1 wherein the step (a) comprises:

accessing circuit data wherein the tri-state multiplexer is a portion of a larger circuit module which has other tri-state multiplexers which require checking, said tri-state multiplexer and other tri-state multiplexers not needing a second checking in order to determine a passing state for the larger circuit module if the tri-state multiplexer and other tri-state multiplexers have each previously been given a passing condition.

6. The method of claim 1 wherein the step (a) comprises:

accessing circuit data wherein the tri-state multiplexer is coupled to a priority encoder; and the step (d) comprises:

detecting the priority encoder coupled to the tri-state multiplexer and automatically setting the condition to a passing condition due to the priority encoder.

7. The method of claim 1 wherein the circuit model uses a circuit clock signal wherein operations are performed in response to active edges of the circuit clock signal, the step (d) comprising the step of:

defining the critical period of time as being any time period in close proximity to the active edges of the circuit clock signal.

8. The method of claim 1 wherein the circuit model uses a circuit clock signal wherein operations are performed in response to active edges of the circuit clock signal, the step (d) comprising the step of:

defining the critical period of time as being any time period which overlaps at least one active edge of the circuit clock signal.

9. The method of claim 1 wherein the entire cone of logic comprises one or more logic devices between one control input and an input device.

10. The method of claim 9 wherein the input device is a device selected from a group consisting of: a flip-flop, a binary storage device, an input terminal, an input pin, a latch, a black box circuit module, a failing condition multiplexer, and a power supply terminal.

11. The method of claim 9 wherein the one or more logic devices are one or more devices selected from a group consisting of: an AND gate, a NAND gate, an OR gate, a NOR gate, an inverter, a buffer, an XOR gate, a complex logic gate for which there is a predetermined logical definition, and an XNOR gate.

12. The method of claim 1 wherein the step (c) further comprises:

forming the data structure corresponding to each data input in the plurality of data inputs, the data structure corresponding to each data input in the plurality of data inputs being used along with the data structure corresponding to each control input in the tri-state multiplexer in order to determine a passing condition or a failing condition.

13. The method of claim 1 wherein the step (g) comprises:

determining a failing condition if the sub-portion equals the entire cone of logic in steps (c) through (f) and no passing condition is determined.

14. The method of claim 1 wherein the step (e) comprising:

determining a passing condition for a first tri-state multiplexer which has an input logically affected by an output of a second tri-state multiplexer if the second tri-state multiplexer outputs a high impedance value as long as the input logically affected by the output of the second tri-state multiplexer is not selected for coupling to an output of the first tri-state multiplexer while the high impedance value is asserted.

15. The method of claim 1 wherein the step (a) comprises:

accessing circuit data wherein the tri-state multiplexer is a portion of a larger circuit module, the tri-state multiplexer not needing a second checking in order to determine a passing state for the larger circuit module if the tri-state multiplexer has previously been given a passing condition, the tri-state multiplexer needing further processing to determine a passing condition of the larger circuit module if the tri-state multiplexer currently has a failing state.

16. A method for testing a circuit, the method comprising the steps of:

accessing a circuit model, the circuit model including at least one tri-state multiplexer having a plurality of data inputs, an output, and a plurality of control inputs which selectively determine which input is coupled to the output, one control input corresponding to one data input;

creating at least one binary input data structure which represents logic coupled to each data input in the plurality of data inputs;

creating at least one binary control data structure which represents logic coupled to each control input in the plurality of control inputs;

determining either a passing status or a failing status for the at least one tri-state multiplexer by using the at least one binary input data structure and the at least one binary control data structure, the tri-state multiplexer being given the failing status if either: (1) any two control signals in the plurality of control inputs are simultaneously asserted at a critical period of time wherein the data inputs corresponding the any two control signals have different logic values; or (2) no control signal in the plurality of control inputs is asserted at the critical period of time, the tri-state multiplexer being given the passing status if: (1) only one control signal in the plurality of control inputs is asserted at the critical period of time or no two or more control signals in the plurality of control inputs are simultaneously asserted at a critical period of time wherein the data inputs corresponding the any two control signals have different logic values; and (2) at least one control signal is asserted during all critical time periods.

17. The method of claim 16 wherein the critical period of time is any period of time which overlaps an active clock edge of a clock signal which is used to perform operations within the circuit model.

18. The method of claim 16 wherein the step of determining either a passing status or a failing status comprises:

performing AND logical operations on the at least one binary control data structure to determine either criterion (1) and (2) for the passing status or criterion (1) or (2) for the failing status.

19. The method of claim 16 wherein the at least one binary control data structure is a binary decision diagram (BDD) having a plurality of nodes and pointers.

20. A method for testing a tri-state multiplexer for proper operation, the method comprising the steps of:

accessing a circuit model of the tri-state multiplexer, the tri-state multiplexer having an output, a plurality of data inputs, and a plurality of control inputs, each control input corresponding to one data input, each control input being coupled to a cone of logic wherein the cone of logic has N serially-coupled logic gates wherein N is a finite integer greater than zero;

forming a first binary data structure for each data input in the plurality of data inputs;

forming a second binary data structure for each control input in the plurality of control inputs by using a sub-portion of each cone of logic coupled to the control inputs in the plurality of control inputs;

determining, via logic operations performed on the first and second binary data structures, whether the tri-state multiplexer is either in a passing state or a failing state; and iteratively generating larger second binary data structures by using progressively larger sub-portions of each cone of logic coupled to the control inputs in the plurality of control inputs until a passing state is determined or no larger second binary data structures are logically possible.

21. The method of claim 20 wherein the steps of determining and iteratively generating comprise:

generating a failing status if either: (1) any two control signals in the plurality of control inputs are simultaneously asserted at a critical period of time wherein the data inputs corresponding the any two control signals have different logic values; or (2) no control signal in the plurality of control inputs is asserted at a critical period of time, and generating a passing status if: (1) only one control signal in the plurality of control inputs is asserted at a critical period of time or no two or more control signals in the plurality of control inputs are simultaneously asserted at a critical period of time wherein the data inputs corresponding the any two control signals have different logic values; and (2) at least one control signals is asserted during all critical time periods.

22. The method of claim 20 wherein the step of iteratively generating comprises:

determining an indeterminate state instead of one of either a passing or failing state for the tri-state multiplexer due to the larger second binary data structures becoming too large to be processed in a predetermined amount of time.

23. A data processing system for testing an operation of a tri-state multiplexer, the data processing system comprising:

an execution device for processing data;

a memory unit coupled to the execution device by a bus, the memory unit comprising:

a circuit model comprising a multiplexer having a plurality of data inputs, an output, and a plurality of control inputs which are selectively asserted to coupled one data input in the plurality of data inputs to the output, the circuit model simulating an electrical circuit when the circuit model is exercised via the execution device;

a multiplexer checker for receiving, as input, data from the circuit model identifying the multiplexer, the multiplexer checker building binary data structures in the memory unit which describe the operation of the multiplexer, the multiplexer checker manipulating the binary data structure to determine a passing condition or a failing condition of the multiplexer as coupled in the circuit model, the passing condition is determined if only one control input in the plurality of control inputs to the tri-state multiplexer is enabled at a critical period of time, a failing condition is determined if more than one or no control inputs are enabled to the tri-state multiplexer at the critical period of time, the execution device iteratively generating newer and larger binary data structures in the memory unit wherein the newer and larger binary data structures further describe the operation of the multiplexer, the newer and larger binary data structures being iteratively generated and processed until either a failing or passing condition can be determined for the multiplexer.

24. The data processing system of claim 23 wherein the circuit model contains a plurality of multiplexers and the multiplexer checker operates on each of the multiplexers in the plurality of multiplexers in a serial manner.

25. The data processing system of claim 23 wherein multiplexer is a tri-state multiplexer.

26. The data processing system of claim 23 wherein the critical period of time is any period of time which overlaps an occurrence of an active clock edge of a clock which is used to enable a transfer of signals in the circuit model.

27. A tester for testing a tri-state multiplexer for proper operation, the tester comprising:

means for reading a tri-state multiplexer circuit configuration from a computer memory;

means for reading a cone of logic configuration coupled to the tri-state multiplexer circuit;

means for iteratively generating a binary data structure then storing the binary data structure into the computer memory, each binary data structure iteratively generated being either a same size or larger in size than a previously-generated binary data structure since each binary data structure iteratively generated represents an iteratively larger portion of the cone of logic configuration on each iteration; and means for analyzing the binary data structure which is iteratively generated to determine, in a minimal number of iterations, if the tri-state multiplexer is properly designed as connected in computer memory.

28. The tester of claim 27 wherein the means for analyzing comprises:

means for generating a failing status if either: (1) any two select signals coupled as part of the tri-state multiplexer configuration are simultaneously asserted at a critical period of time wherein data inputs to the tri-state multiplexer configuration which is controlled by the any two select signals have different logic values; or (2) no select signal coupled as part of the tri-state multiplexer configuration is asserted at a critical period of time whereby an output of the tri-state multiplexer configuration is in a tri-state condition.

29. The tester of claim 27 wherein the means for analyzing comprises:

means for generating a passing status if: (1) the only one select signal is asserted at a critical period of time or no two or more select signals are simultaneously asserted at a critical period of time wherein the data inputs corresponding the any two select signals have different logic values; and (2) at least one select signals is asserted during all critical time periods.

30. The tester of claim 27 wherein the means for analyzing comprises:

means for generating a non-testable status for the tri-state multiplexer configuration if, during iteration, the binary data structure becomes too large to efficiently process.

31. A tester for testing a tri-state multiplexer for proper operation, the tester comprising:

means for reading a tri-state multiplexer circuit configuration from a computer memory;

means for reading a cone of logic configuration coupled to the tri-state multiplexer circuit;

means for generating a binary data structure stored in computer memory, the binary data structure representing the connectivity of at least a portion of the cone of logic configuration;

means for analyzing the binary data structure which is iteratively generated to determine, in a minimal number of iterations, if the tri-state multiplexer is properly designed as connected in computer memory;

means for generating a failing status by inspecting the binary data structure, the failing status being provided if either: (1) any two enable signals coupled as part of the tri-state multiplexer configuration are simultaneously asserted at a critical period of time wherein data inputs to the tri-state multiplexer configuration which is controlled by the any two enable signals have different logic values; or (2) no enable signal coupled as part of the tri-state multiplexer configuration is asserted at a critical period of time whereby an output of the tri-state multiplexer configuration is in a tri-state condition;

means for generating a passing status by inspecting the binary data structure, the passing status being provided if: (1) the only one enable signal is asserted at a critical period of time or no two or more enable signals are simultaneously asserted at a critical period of time wherein the data inputs corresponding the any two enable signals have different logic values; and (2) at least one enable signals is asserted during all critical time periods;

means for generating a non-testable status for the tri-state multiplexer configuration if the binary data structure is too large to efficiently process.

* * * * *